United States Patent [19]

Monticelli

[11] 4,431,930
[45] Feb. 14, 1984

[54] DIGITAL TIME DOMAIN NOISE FILTER

[75] Inventor: Dennis M. Monticelli, Fremont, Calif.

[73] Assignee: National Semiconductor Corporation, Santa Clara, Calif.

[21] Appl. No.: 308,342

[22] Filed: Oct. 5, 1981

[51] Int. Cl.³ .................. H03K 17/30; H03K 17/60; H03K 5/01; H03K 5/08

[52] U.S. Cl. .................. 307/520; 307/247 R; 307/255; 307/543

[58] Field of Search .......... 307/520, 247 A, 247 R, 307/255, 290, 246; 328/127, 128, 167

[56] References Cited

U.S. PATENT DOCUMENTS

| | | | |
|---|---|---|---|
| 3,018,386 | 1/1962 | Chase | 307/290 |
| 3,054,910 | 9/1962 | Bothwell | 307/290 |
| 3,192,403 | 6/1965 | Bernfeld et al. | 307/255 |
| 3,230,521 | 1/1966 | Davis | 307/255 |
| 3,260,943 | 7/1966 | Huelsman et al. | 307/255 |
| 3,460,000 | 8/1969 | Kiffmeyer | 307/290 |
| 3,737,682 | 6/1973 | Ahmed | 307/247 R |

*Primary Examiner*—John S. Heyman
*Assistant Examiner*—Timothy P. Callahan
*Attorney, Agent, or Firm*—Gail W. Woodward; Paul J. Winters; Michael J. Pollock

[57] ABSTRACT

A trigger circuit with hysteresis is created by driving a latch circuit set and reset terminals through a pair of emitter driven complementary transistors the bases of which are returned to a reference potential $V_{REF}$. The hysteresis is set by the $V_{BE}$ potentials of the complementary transistors. When the input emitters are driven more than one $V_{BE}$ above $V_{REF}$, one transistor will conduct and set the latch. When the input falls below one $V_{BE}$ below $V_{REF}$, the other transistor will conduct and reset the latch. A digital filter is created by coupling a capacitor across the trigger circuit input and digitally driving the capacitor through a transconductance amplifier.

4 Claims, 3 Drawing Figures

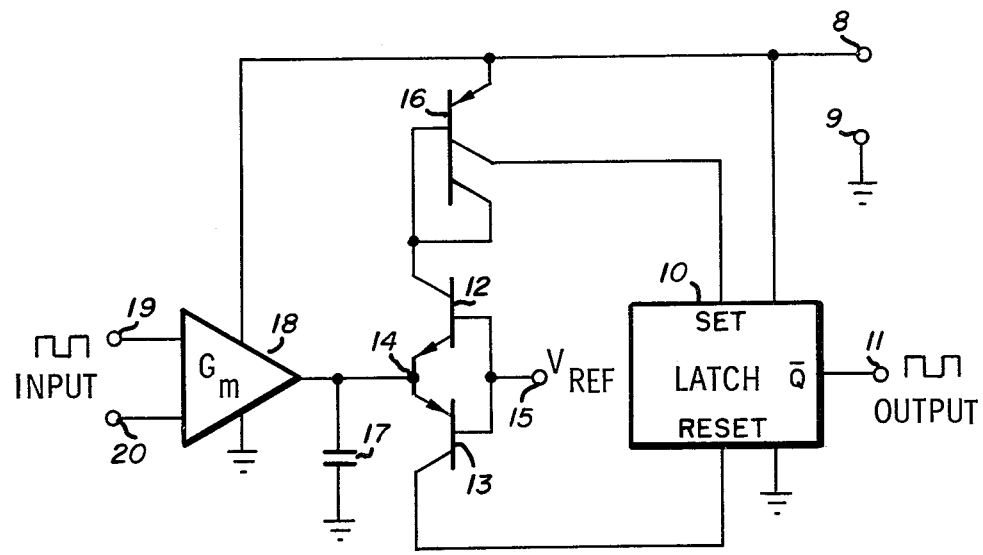
Fig_1
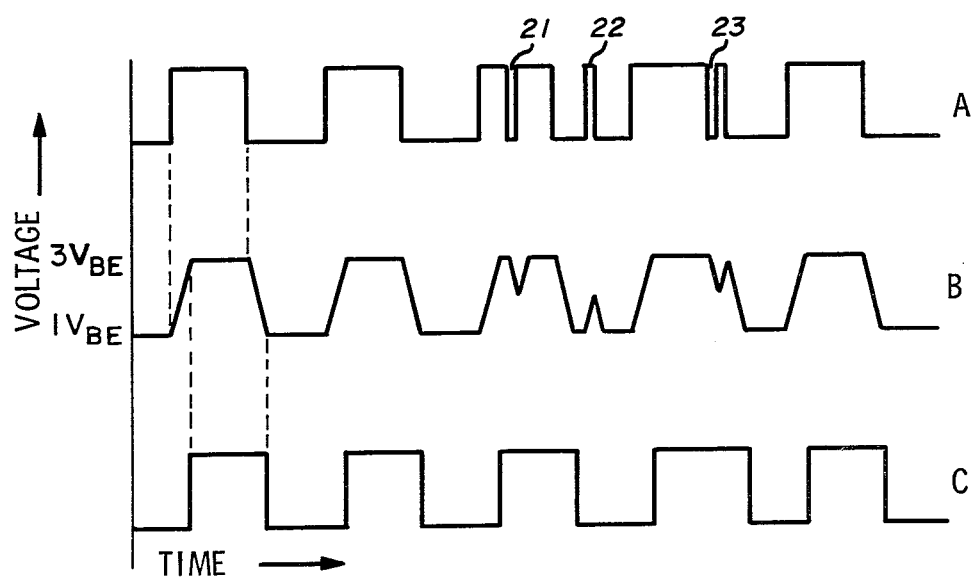
Fig_2

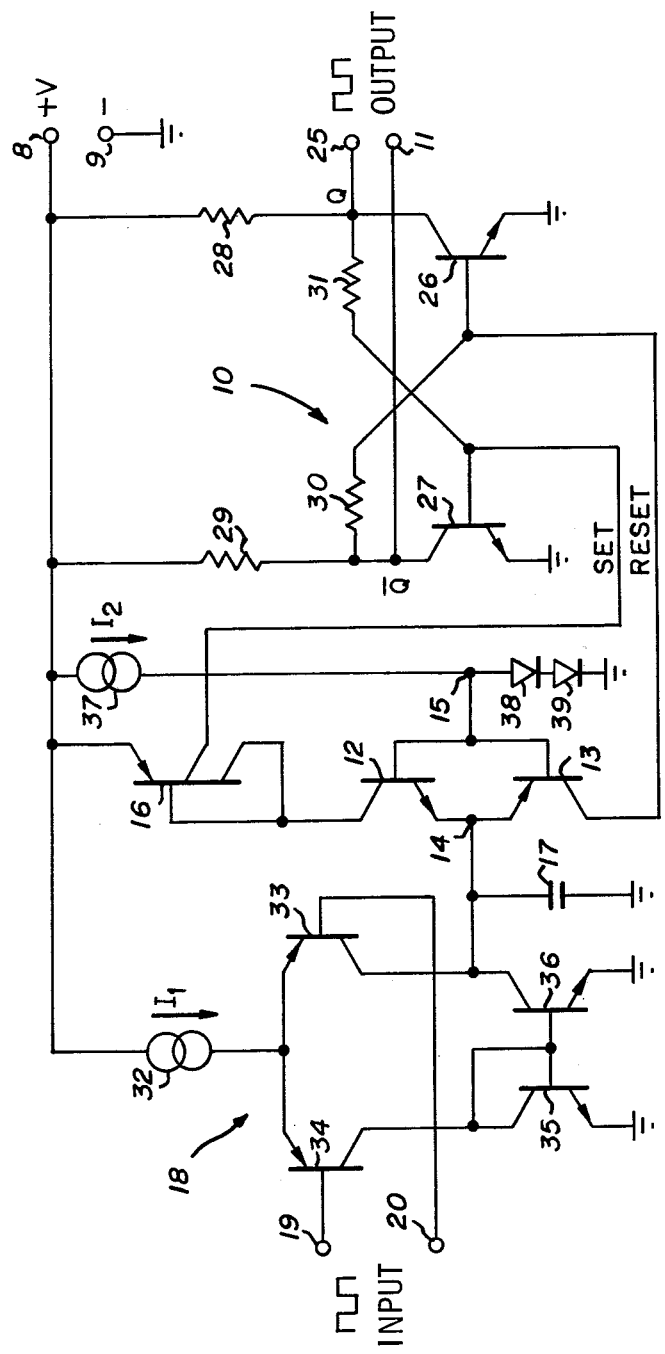
Fig_3

DIGITAL TIME DOMAIN NOISE FILTER

BACKGROUND OF THE INVENTION

The invention relates to digital communications systems and in particular is useful in carrier current transmission systems. In my copending application Ser. No. 307,705 filed Oct. 2, 1981 with Michael E. Wright and Robert S. Sleeth titled DIFFERENTIAL SAMPLE AND HOLD COUPLING CIRCUIT, and assigned to the assignee of the present invention, a digital carrier current receiver is described. A comparator provides the digital receiver output in a frequency modulated system which provides a degree of noise immunity. However, a carrier current system is still subject to the impulse noise commonly present on power lines and additional noise suppression is very desirable. The present invention relates to a time domain filter that can be incorporated into a carrier current receiver after the above-mentioned comparator.

SUMMARY OF THE INVENTION

It is an object of the invention to provide a monolithic integrated circuit that can respond to a digital signal with input hysteresis such as normally provided by a Schmitt trigger circuit.

It is a further object of the invention to provide a time domain digital filter circuit that can be incorporated into a digital signal receiver to increase its noise immunity.

It is a still further object of the invention to drive a capacitor from a transconductance amplifier having a data input so that the capacitor develops a ramp function which in turn drives a hysteresis switching latch that produces a data output with improved noise immunity.

These and other objects are achieved using the following circuit elements. A simple latch is provided with a hysteresis driver by employing a pair of complementary transistors emitter driven in common. One transistor (the PNP) has its collector directly coupled to the latch reset terminal, while the other transistor (the NPN) has its collector coupled via a current mirror to the latch set terminal. The complementary transistors both have their bases returned to a $V_{REF}$ bias that is normally operated at $2V_{BE}$. Thus when the input signal drops to $V_{BE}$, the NPN transistor turns on, the input signal is clamped at $V_{BE}$, and the latch is set. When the input potential rises to $3V_{BE}$, the PNP transistor will turn on, the input signal will clamp at $3V_{BE}$, and the latch will be reset. Thus a hysteresis response is created to span a $2V_{BE}$ range and the transconductance amplifier output will be kept from saturating due to the clamping action.

A capacitor is coupled from the hysteresis input to ground and is driven from a transconductance amplifier that is operated from a data input signal. When the data signal causes the capacitor to charge, a positive ramp is generated across the capacitor and when the capacitor is caused to discharge an equivalent down or negative ramp is generated. Such a circuit will not trip when the noise spikes present in the data input are narrower than the ramp width so that a low pass noise filter action is obtained. More precisely, the circuit discriminates noise based upon its time duration rather than its frequency spectrum.

BRIEF DESCRIPTION OF THE DRAWING

FIG. 1 is a block diagram of the circuit of the invention.

FIG. 2 is a series of graphs showing the signals produced in the circuit of FIG. 1.

FIG. 3 is a schematic diagram of an integrated circuit version of the circuit of the invention.

DESCRIPTION OF THE INVENTION

With reference to FIG. 1, the circuit is operated from a power supply coupled between positive terminal 8 and ground 9. An R-S latch 10 provides a digital $\bar{Q}$ output at terminal 11. An NPN transistor 12 and a PNP transistor 13 are coupled to set and reset latch 10 respectively. The complementary transistors 12 and 13 are emitter driven at circuit node 14. Their bases are commonly returned to a source of $V_{REF}$ at terminal 15. Typically the value of $V_{REF}$ will be held at $2V_{BE}$ or about 1.2 volts at 25° C. The collector of transistor 13 is directly coupled to the reset terminal of latch 10, while the collector of transistor 12 is coupled to the latch 10 set terminal by way of current mirror 16.

As node 14 is driven positively, it can be seen that when the potential exceeds $3V_{BE}$ transistor 13 will turn on and act to clamp the potential because of the low input impedance of the common base configuration. At the same time a reset current pulse will be applied to latch 10.

When node 14 is driven down or negatively, transistor 12 will turn on when the potential goes below $V_{BE}$ and act to clamp the potential at this level because of its low common base input impedance. At the same time transistor 12 will couple a current pulse to mirror 16 which will in turn couple a mirrored current pulse to the set terminal of latch 10.

Capacitor 17 is coupled between node 14 and ground. Its value is selected in combination with the current drive capability of transconductance amplifier 18 to provide a ramp voltage function at node 14. Amplifier 18 is differentially driven from input terminals 19 and 20 from a data signal source that has the form of waveform A of FIG. 2. As explained above, when such a signal is employed in a carrier current system, it can be noisy. In FIG. 2 waveform A shows noise pulses at 21, 22, and 23. While noise pulse 22 is positive and is present between data pulses, the pulses at 21 and 23 occur within a data pulse and are negative.

As shown in waveform B of FIG. 2, the presence of capacitor 17 produces a voltage ramping action that causes node 14 to swing between $V_{BE}$ and $3V_{BE}$. In effect amplifier 18 as driven from terminals 19 and 20 will overdrive node 14 which is clamped by transistors 12 and 13. Waveform C of FIG. 2 shows the $\bar{Q}$ output of latch 10. It will be noted that the narrow noise pulses at 21, 22, and 23 do not last long enough to permit the ramp function to swing node 14 far enough to operate latch 10. In other words, any noise pulse that is not wide enough to appear as a data pulse will be ignored or filtered out by the digital circuit. Thus the digital filter action is in the time domain. Note that noise pulses 21 and 22, which occur near the middle of a proper data pulse, are wholly rejected by the filter. However, any noise pulse that occurs during the ramp period, such as 23, will manifest as a lengthening of the proper data pulse as it appears at the output. Small amounts of pulse width distortion are greatly preferable to the severe amplitude distortion that would otherwise result. Most data coding schemes are tolerant of small amounts of pulse jitter. The pulse width discrimination action can be selected by varying the value of capacitor 17 in combination with the current drive performance of transconductance amplifier 18.

FIG. 3 is a schematic diagram showing how FIG. 1 can be implemented using conventional integrated circuit components. Where the parts are the same as those of FIG. 1, the same numbers are used.

Latch 10 is implemented with transistors 26 and 27 which employ load resistors 28 and 29 respectively. Cross coupled feedback resistors 30 and 31 complete the latching configuration. The collector of transistor 27 provides the $\overline{Q}$ output of the latch at output terminal 11 and the collector of transistor 26 provides the Q output at terminal 25.

Transconductance amplifier 18 is made up of differentially operated transistors 33 and 34. Current source 32 provides tail current $I_1$ and current mirror load transistors 35 and 36 provide a single ended output. In operation, when input terminal 20 is driven below terminal 19, most of $I_1$ flows in transistor 33 to charge capacitor 17. Thus source 32 and capacitor 17 set the up ramp.

When terminal 19 is driven below terminal 20, transistor 34 is on and $I_1$ will flow in transistor 35. Provided that transistors 35 and 36 are the same size, the same current will flow in transistor 36 and act to discharge capacitor 17. Thus the down ramp is also set by source 32 and capacitor 17.

The value of $V_{REF}$ at node 15 is established at $2V_{BE}$ by passing $I_2$ from source 37 through diodes 38 and 39, which are thereby forward biased. When the up ramp drives node 14 to $3V_{Be}$, transistor 13 will turn on so as to clamp the voltage at this level and $I_1$ will flow as latch reset current into the base of transistor 26. When the down ramp drives node 14 below $V_{Be}$, transistor 12 will turn on and clamp the voltage. At this point the mirrored $I_1$ flowing in transistor 36 will flow in transistor 12. Transistor 16 will again mirror $I_1$ which will then flow as latch set current into the base of transistor 27.

The invention has been described in such terms that will enable a person skilled in the art to practice it. Clearly there are alternatives and equivalents, within the spirit and intent of the invention, that will occur to him upon reading the foregoing description. For example, while a bipolar transistor embodiment is detailed, other circuit forms, such as CMOS, NMOS, or PMOS, could be employed. Accordingly, it is intended that the scope of the invention be limited only the following claims.

I claim:

1. A trigger circuit comprising:
   latch means having a digital output and set and reset input means;
   a pair of complementary input transistors having their outputs respectively coupled to said set and reset inputs wherein one of said complementary transistor outputs is directly coupled to said latch and the other transistor output is coupled by way of a current mirror;
   means for coupling the control electrodes of said complementary transistors in common to a source of reference potential; and
   means for coupling the input electrodes of said complementary transistors in common to a signal input circuit whereby said latch changes state when said signal input rises to a first threshold level and when said input falls below a second threshold level.

2. The trigger circuit of claim 1 wherein said current mirror comprises a dual collector PNP transistor having one collector directly coupled to its base.

3. The trigger circuit of claim 1 in further combination with a digital signal source and a ramp generator to create a digital noise filter.

4. The filter of claim 3 wherein said ramp generator comprises a transconductance amplifier coupled to said digital signal source and a capacitor coupled to its output whereby said capacitor charges and discharges in response to said transconductance amplifier output current thereby generating a ramp function in response to the digital input and whereby digital noise signals narrower than the duration of said ramp are removed.

* * * * *